United States Patent
Yamaguchi

(10) Patent No.: US 12,389,737 B2
(45) Date of Patent: Aug. 12, 2025

(54) PHOTOELECTRIC CONVERSION ELEMENT

(71) Applicant: CANON KABUSHIKI KAISHA, Tokyo (JP)

(72) Inventor: Tomona Yamaguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 885 days.

(21) Appl. No.: 17/574,165

(22) Filed: Jan. 12, 2022

(65) Prior Publication Data

US 2022/0238824 A1    Jul. 28, 2022

(30) Foreign Application Priority Data

Jan. 18, 2021 (JP) .................. 2021-005752
Dec. 17, 2021 (JP) .................. 2021-205143

(51) Int. Cl.
| | | |
|---|---|---|
| *H10K 39/32* | (2023.01) | |
| *H10K 30/10* | (2023.01) | |
| H10K 30/35 | (2023.01) | |
| H10K 85/00 | (2023.01) | |
| H10K 85/10 | (2023.01) | |
| H10K 85/60 | (2023.01) | |
| H10K 102/10 | (2023.01) | |

(52) U.S. Cl.
CPC ............ *H10K 39/32* (2023.02); *H10K 30/10* (2023.02); *H10K 30/35* (2023.02); *H10K 85/00* (2023.02); *H10K 85/113* (2023.02); *H10K 85/151* (2023.02); *H10K 85/615* (2023.02); *H10K 85/626* (2023.02); *H10K 85/631* (2023.02); *H10K 85/633* (2023.02); *H10K 85/6572* (2023.02); *H10K 2102/101* (2023.02)

(58) Field of Classification Search
None
See application file for complete search history.

(56) References Cited

U.S. PATENT DOCUMENTS

2007/0162263 A1    7/2007  Forrest

FOREIGN PATENT DOCUMENTS

WO    2019058448 A1    3/2019

OTHER PUBLICATIONS

Mcdonald, S.A., et al., "Solution-processed PbS quantum dot infrared photodetectors and photovoltaics", Nature Materials, Feb. 2005, pp. 138-143, vol. 4.

*Primary Examiner* — Andrew K Bohaty
(74) *Attorney, Agent, or Firm* — Canon U.S.A., Inc. IP Division

(57) ABSTRACT

A photoelectric conversion element including a first electrode, a photoelectric conversion layer, and a second electrode, in this order, wherein the photoelectric conversion layer contains a quantum dot and an organic compound, satisfies formula (1), a predetermined carrier mobility, and a predetermined energy level, and reduces a residual image, $E2>E1$ formula (1). E1 (eV) is the energy at a short-wavelength edge in a wavelength region of light detected by the photoelectric conversion element. E2 (eV) is the band gap of the organic compound.

20 Claims, 8 Drawing Sheets

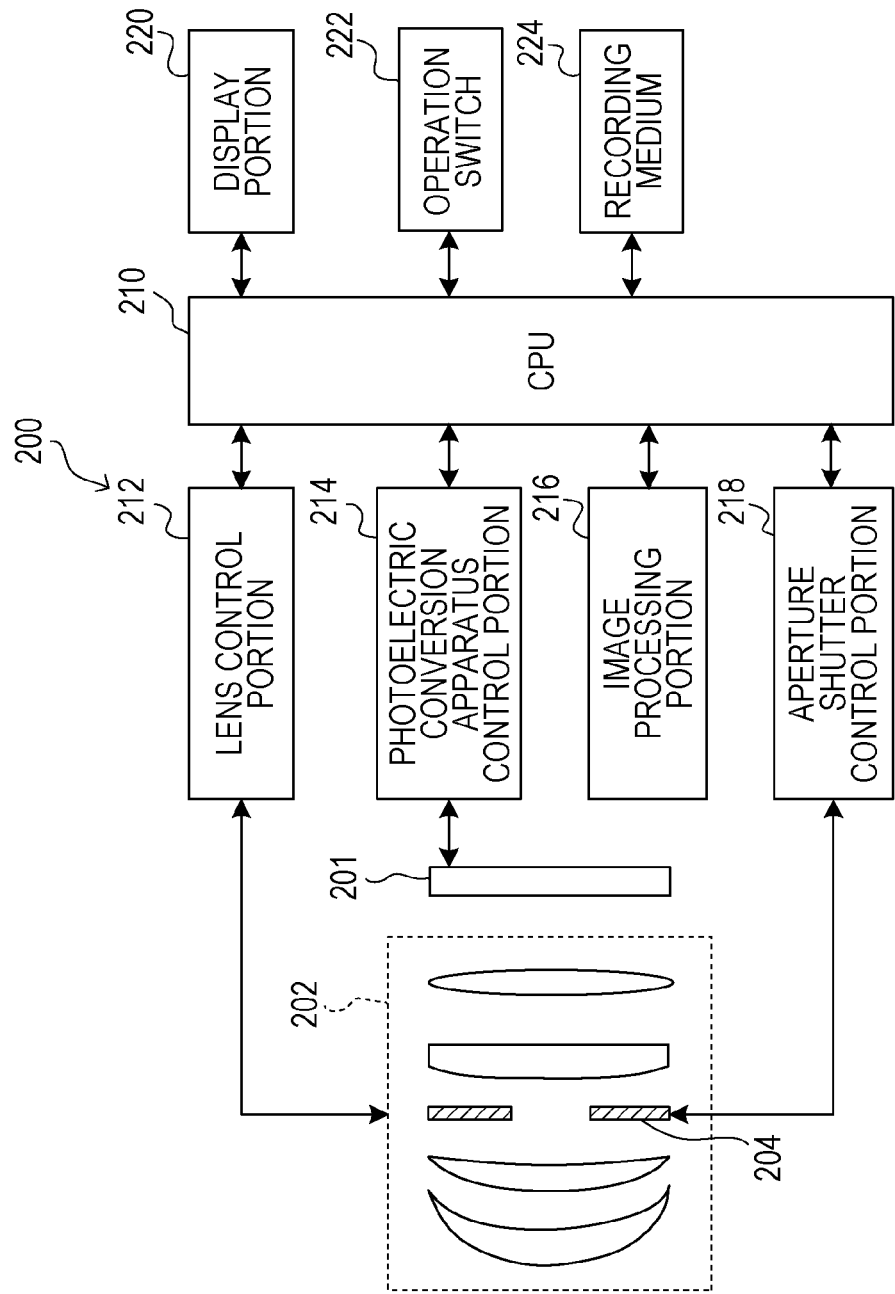

PHOTOELECTRIC CONVERSION ELEMENT

BACKGROUND OF THE INVENTION

Field of the Invention

The present disclosure relates to a photoelectric conversion element.

Description of the Related Art

To date, photodiodes including an impurity diffusion layer formed on a single-crystal silicon substrate have been widely used as photoelectric conversion portions of photo detectors constituting solid-state imaging apparatuses. In recent years, photo detectors composed of photo conversion films using an organic material having high photosensitivity in a long-wavelength region, in which silicon has low sensitivity, or a nano particle called a colloidal quantum dot have been proposed. The photoelectric conversion films may be formed by using a simple process such as vacuum vapor deposition or coating. Consequently, the photoelectric conversion film being formed above the substrate, that is, in the light-incident side, enables a photo detector having a reduced area per pixel and high light use efficiency to be fabricated.

Regarding a photo detector using a quantum dot, research on a use of longer wavelength from the visible light region to the near-infrared region have started. However, there are few examples of application to photoelectric conversion film image sensors, while fundamental research is performed.

A quantum dot having sensitivity in the long-wavelength region has a large particle diameter and a large surface area and, therefore, oxidation on the quantum dot surface and aggregation tend to occur. Consequently, in a photoelectric conversion element using the quantum dot, a dark current increases due to formation of an electron trap level and a reduction in the band gap. Regarding most of photoelectric conversion films in photo detectors using the quantum dot in the related art, the constituent element is quantum dot only, and the structure tends to cause aggregation of the quantum dot.

U.S. Patent Application Publication No. 2007/0162263, International Publication No. WO 2019/058448, and Nature Materials 4 (2005) 138 disclose photoelectric conversion elements having a photoelectric conversion layer in which the quantum dot is dispersed in a bulk semiconductor.

According to the technologies disclosed in the above-described literature in the related art, it is conjectured that there is an effect of suppressing oxidation and aggregation of the quantum dot. However, in all the technologies, both the bulk semiconductor and the quantum dot have a photoelectric conversion capability, and the photoelectric conversion efficiency in the long-wavelength region in which just the quantum dot is exposed to light is suppressed due to an influence of carrier inflow from a nearby bulk semiconductor and recombination.

Consequently, a dark current increases in the photoelectric conversion element using the quantum dot for the photoelectric conversion film having sensitivity in the long-wavelength region, and a residual image increases in the photoelectric conversion film image sensor using the quantum dot.

SUMMARY OF THE INVENTION

The present disclosure provides a photoelectric conversion element and a photoelectric conversion apparatus in which a dark current and a residual image are reduced.

A photoelectric conversion element according to the present disclosure includes a first electrode, a photoelectric conversion layer, and a second electrode, in this order, wherein the photoelectric conversion layer contains a quantum dot and an organic compound and satisfies formulae (1), (2), and (3), $$E2 > E1 \quad \text{formula (1)}$$

E1 (eV): energy at a short-wavelength edge in a wavelength region of light detected by the photoelectric conversion element
E2 (eV): band gap of the organic compound $$\mu h_{org} > \mu h_{QD} \quad \text{formula (2)}$$

$\mu h_{org}$ (cm$^2$/Vs): hole mobility of the organic compound in the photoelectric conversion layer
$\mu h_{QD}$ (cm$^2$/Vs): hole mobility of the quantum dot in the photoelectric conversion layer $$Ip_{org} \leq Ip_{QD} + 0.2 \quad \text{formula (3)}$$

$Ip_{org}$ (eV): ionization potential of the organic compound
$Ip_{QD}$ (eV): ionization potential of the quantum dot.

Further features of the present disclosure will become apparent from the following description of exemplary embodiments with reference to the attached drawings.

BRIEF DESCRIPTION OF THE DRAWINGS

FIG. 6 is a diagram illustrating an example of an imaging system by using a photoelectric conversion element according to an embodiment of the present disclosure.

DESCRIPTION OF THE EMBODIMENTS

Figure 1:
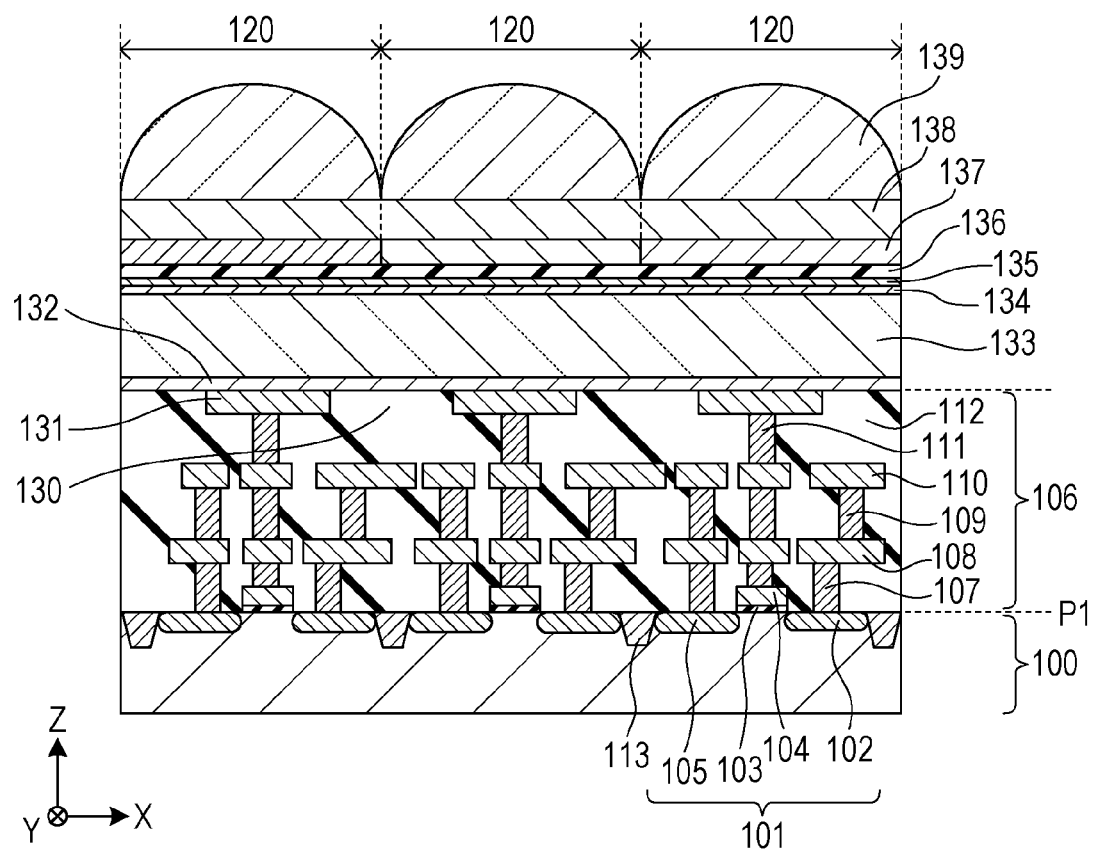
FIG. 1 is a schematic sectional view illustrating a photoelectric conversion apparatus according to the present embodiment.

A photoelectric conversion element according to the present disclosure will be described with reference to the drawings. Each embodiment illustrates an example of the present disclosure, and numerical values, shapes, materials, constituent elements, arrangement and connection of constituent elements, and the like do not limit the present disclosure. For example, transistors, semiconductor regions, and the like will be described in each embodiment, and the conductivity type thereof is appropriately changed.

In the drawings, the configurations indicated by the same references are equivalent configurations and duplicate explanations may be omitted. In this regard, the reference may be omitted with respect to the configuration considered to be a repeated pattern or the same constituent.

Photoelectric Conversion Element and Photoelectric Conversion Apparatus

FIG. 1 is a schematic sectional view illustrating three unit cells 120 of a photoelectric conversion apparatus. Herein, FIG. 1 illustrates a cross section in a plane including the Z-direction which is an upward direction and the X-direction. The unit cell 120 is also referred to as a pixel or a sub-pixel. Each unit cell 120 has an equivalent circuit arrangement and includes at least one photoelectric conversion element. In the present embodiment, a configuration in which each unit cell 120 includes a photoelectric conversion element is illustrated. The photoelectric conversion element is formed by appropriately selecting a material for a photoelectric conversion layer 133 described later. The circuit configuration of the unit cell of the photoelectric conversion apparatus is appropriately set. Next, the photoelectric conversion apparatus illustrated in FIG. 1 will be described in detail.

Substrate 100

In FIG. 1, a substrate 100 has a principal surface P1. The material for forming the substrate 100 may be glass, ceramic, or the like, and in the present embodiment, the semiconductor substrate is formed of a silicon single crystal. The substrate 100 includes a transistor 101 and an element isolation portion 113. The transistor 101 includes a source-drain region 102, a gate insulating film 103, a gate electrode 104, and a source-drain region 105. The gate electrode 104 is disposed on the principal surface P1. The gate insulating film 103 is located between the gate electrode 104 and the principal surface P1. The source-drain region 102 and the source-drain region 105 are disposed inside the substrate 100.

Wiring Structure 106

A wiring structure 106 is disposed on the principal surface P1 of the substrate 100. The wiring structure 106 includes a contact plug 107, a wiring layer 108, a via plug 109, a wiring layer 110, a via plug 111, and an insulating film 112. The insulating film 112 is not specifically illustrated in FIG. 1 and may be a multilayer film. Common materials for forming a semiconductor may be used for these members.

Electrode (First Electrode 131, Second Electrode 135)

The photoelectric conversion apparatus illustrated in FIG. 1 includes a first electrode 131 and a second electrode 135. The first electrode 131 may be an electron-capturing electrode, a cathode, or a negative electrode. The second electrode 135 may be a hole-capturing electrode, an anode, or a positive electrode. One of the first electrode 131 and the second electrode 135 may be an upper electrode and the other may be a lower electrode. In FIG. 1, the first electrode 131 is the lower electrode, and the second electrode 135 is the upper electrode.

The second electrode 135 is disposed above the substrate 100. The second electrode 135 is continuously disposed over three unit cells 120. In the present embodiment, the upper surface and the lower surface of the second electrode 135 are flat.

The first electrode 131 is disposed between the substrate 100 and the second electrode 135. At least one first electrode is included in each unit cell 120. In the configuration according to the present embodiment, a first electrode 131 is disposed in each unit cell 120. An isolation region 130 is disposed between a plurality of first electrodes 131. The isolation region 130 may be the insulating film 112 of the wiring structure 106.

The first electrode 131 and the second electrode 135 is formed of any material having conductivity for the electrode. Examples of the constituent material of the electrode include metals, such as platinum, gold, silver, aluminum, chromium, nickel, copper, titanium, and magnesium or alloys or nitrides thereof and metal oxides, such as indium oxide and tin oxide or complex oxides thereof (for example, ITO and IZO).

In addition, examples of the constituent material of the electrode include conductive particles of carbon black, fullerene, carbon nanotube, graphene, and the like or conductive complex materials in which these are dispersed in a matrix such as a polymer binder. The constituent materials of the electrode may be used alone, or at least two types may be used in any combination at any ratio. In the photoelectric conversion element, at least one pair (two) of electrodes are disposed, and the photoelectric conversion layer 133 is disposed between the pair of electrodes. In such an instance, at least one of the pair of electrodes can be transparent because of passing through the light that is absorbed by the photoelectric conversion layer 133.

The electrode has a function of capturing an electron and a hole generated inside the photoelectric conversion layer 133. Therefore, regarding the constituent material of the electrode, a constituent material suitable for capturing an electron and a hole, of the above-described materials, can be used. Examples of the material for forming the second electrode 135 include materials suitable for capturing a hole, such as materials having a high work function, for example, Au and ITO. On the other hand, examples of the material for forming the first electrode 131 include materials suitable for capturing an electron, such as materials having a low work function, for example, Al, titanium, and titanium nitride. Of these, titanium or titanium nitride can be adopted. There is no particular limitation regarding the thickness of the electrode, and the thickness is appropriately determined in consideration of the material used, necessary conductivity, transparency, and the like. The thickness is usually about 10 nm or more and 10 μm or less.

Photoelectric Conversion Layer 133

The photoelectric conversion layer 133 is disposed between each first electrode 131 and each second electrode 135. The photoelectric conversion layer 133 contains a quantum dot and an organic compound. The photoelectric conversion layer 133 performs photoelectric conversion, and the first electrode 131 reads a signal based on an electric charge generated through photoelectric conversion.

The material for forming the photoelectric conversion layer 133 may be an inorganic material or an organic material. For example, amorphous silicon, an organic semiconductor, a quantum dot that is an assembly of nanoparticles of a compound semiconductor material, or the like may be used for the photoelectric conversion layer. For example, fullerene (C60), coumarine 6 (C6), rhodamine 6G (R6G), quinacridone, a phthalocyanine-based material, and a naphthalocyanine-based material are suitable for the organic semiconductor. In the present embodiment, the photoelectric conversion layer 133 contains a quantum dot such as a colloidal quantum dot composed of nanoparticles of a compound semiconductor material.

The colloidal quantum dot constituting the photoelectric conversion layer 133 includes nanoparticles (average particle diameter of 0.5 nm or more and less than 100 nm). Examples of the material for forming the nanoparticles include group IV semiconductors, group III-V and group II-VI compound semiconductors, and compound semiconductors composed of a combination of at least three elements of group II, group III, group IV, group V, and group VI, which are common semiconductor crystals. Specific examples include semiconductor materials having a relatively narrow band gap, such as PbS, PbSe, PbTe, InN, InAs, InP, InSb, InAs, InGaAs, CdS, CdSe, CdTe, Ge, CuInS, CuInSe, CuInGaSe, and Si. These are also referred to as semiconductor quantum dots. The quantum dot has to include at least one of these semiconductor dot materials. The quantum dot may have a core-shell structure in which the semiconductor quantum dot material serves as a core, and the semiconductor quantum dot material is covered with a covering compound. Since a quantum dot having a size substantially less than or equal to the exciton Bohr radius intrinsic to each semiconductor material exerts a quantum size effect, a predetermined band gap, that is, light absorption wavelength, is controlled in accordance with the size.

Of the semiconductor quantum dot materials above, PbS, PbSe, PbTe, InP, InAs, CdS, CdSe, and CdTe are desirable, and PbS and PbSe are more desirable because of ease in synthesis of the quantum dot. It is desirable that the exciton Bohr radius of PbS be about 18 nm and that the average particle diameter of the quantum dot be 2 nm or more and 15 nm or less. A transmission electron microscope is used for measuring the particle diameter of the quantum dot. The average particle diameter of the quantum dot being set to be 2 nm or more enables the crystal growth of the quantum dot to be readily controlled during synthesis of the quantum dot. By controlling the crystal growth of the quantum dot, a wavelength region in which the photoelectric conversion element has sensitivity can be selected.

The method for fabricating the photoelectric conversion layer 133 constituted by including an assembly of nanoparticles as a quantum dot film is not particularly limited. There is no particular limitation regarding the film thickness of the photoelectric conversion layer 133, and from the viewpoint of obtaining high light absorption properties, 10 nm or more is preferable, and 50 nm or more is more preferable. In addition, from the viewpoint of ease in fabrication, the film thickness of the photoelectric conversion layer 133 is preferably 800 nm or less.

Regarding the quantum dot, an organic ligand, favorably at least one ligand selected from 1,4-benzenedithiol and 1,3-benzenedithiol, can coordinate with the surface of the nanoparticle. In addition, regarding the quantum dot, at least one halogen selected from iodine, chlorine, and bromine can be added to the surface of the nanoparticle. These materials being selected has an effect of protecting a surface defect of the quantum dot and enables the heat resistance to be improved. For example, acquiring the heat resistance to 170° C. or higher enables an on-chip color filter and an on-chip micro lens to be formed and enables multicolor device and an increase in the sensitivity to be realized.

In the present disclosure, "quantum dot" can have a structure in which an organic ligand and a halogen ligand coordinate with the surface of the nanoparticle.

Figure 2:
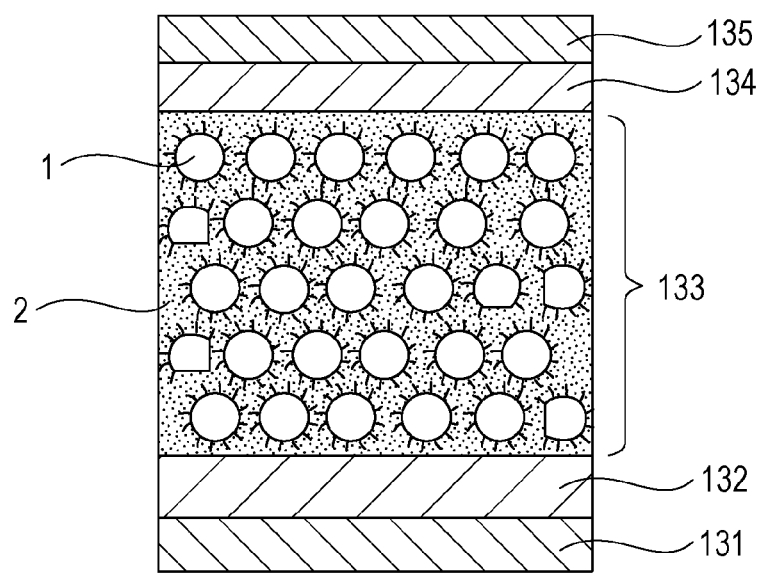
FIG. 2 is a schematic sectional view illustrating a photoelectric conversion element according to the present embodiment.

FIG. 2 is a schematic sectional view illustrating the photoelectric conversion apparatus according to the present embodiment. As illustrated in FIG. 2, the photoelectric conversion layer 133 contains a quantum dot 1 and an organic compound 2. In a photoelectric conversion element including a photoelectric conversion layer composed of quantum dots only, gaps are present between spherical quantum dots (Nature Nanotech. vol 7, 577-582 (2012)). When large-particle-diameter quantum dots exhibiting absorption in the near-infrared light region are used for the photoelectric conversion layer, the photoelectric conversion layer is sparsely filled compared with the small-particle-diameter quantum dots, and gaps are further increased. In this regard, it is known that, particularly in PbS quantum dot, when the particle diameter increases, the proportion of S atoms on the quantum dot surface increases, the surface not protected by a ligand is exposed, and oxidation and aggregation readily occur. Consequently, as illustrated in FIG. 2, an organic compound 2 being added so that gaps are filled therewith enables oxidation and aggregation of quantum dot 1 to be suppressed from occurring and enables a dark current to be prevented from increasing.

Regarding the photoelectric conversion element including the quantum dot, the value of the band gap of the quantum dot being designed enables the wavelength band range in which the sensitivity is exhibited to be selected. For example, the external quantum efficiency illustrated in FIG. 8 exhibits the sensitivity in the long-wavelength side up to about 1,650 nm. The limit of sensitivity in the long-wavelength side is determined in accordance with the band gap of the quantum dot and is about 0.75 eV in the instance illustrated in FIG. 8. When the band gap of the quantum dot is decreased, in the related art, products are unable to be stably supplied due to an aggregation problem of the material. The present disclosure enables the band gap of the quantum dot to be designed to have a value less than 0.9 eV and enables a photoelectric conversion element with an enlarged long-wavelength-side sensitivity band compared with that in the related art to be provided.

The organic compound is a compound that satisfies formulae (1), (2), and (3) below.

$$E2 > E1 \quad \text{formula (1)}$$

E1 (eV): energy at a short-wavelength edge in a wavelength region of light detected by the photoelectric conversion element E2 (eV): band gap of the organic compound $$\mu h_{org} > \mu h_{QD} \quad \text{formula (2)}$$

$\mu h_{org}$ (cm$^2$/Vs): hole mobility of the organic compound in the photoelectric conversion layer $\mu h_{QD}$ (cm$^2$/Vs): hole mobility of the quantum dot in the photoelectric conversion layer $$Ip_{org} \leq Ip_{QD} + 0.2 \quad \text{formula (3)}$$

$Ip_{org}$ (eV): ionization potential of the organic compound $Ip_{QD}$ (eV): ionization potential of the quantum dot When the organic compound satisfying formulae (1), (2), and (3) is used, a dark current and a residual image are reduced. In addition, a photoelectric conversion efficiency (EQE) is also improved. When the ratio $\mu h_{org}/\mu h_{QD}$ of the hole mobility of the organic compound ($\mu h_{org}$) to the hole mobility of the quantum dot ($\mu h_{QD}$) increases, an effect of reducing a dark current and a residual image tends to be further improved. The ratio $\mu h_{org}/\mu h_{QD}$ is preferably 2 or more and more preferably 100 or more. Regarding the organic compound satisfying formula (1), trapping of electric charge and recombination of the quantum dot having low energy difficult to occur, a reduction in dark current and residual image is observed, and the photoelectric conversion efficiency is improved. Regarding the organic compound satisfying formula (2), the number of dark electrons is reduced, and since the hole transportability is improved, an effect of improving a residual image is observed. Regarding the organic compound satisfying formula (3), there is contribution to an improvement of the hole transportability in the photoelectric conversion layer, and an effect of improving a dark current and a residual image is obtained.

On the other hand, a photoelectric conversion element described below can also reduce a dark current.

Specifically, the photoelectric conversion element is a photoelectric conversion element including a first electrode, a first interface layer, a photoelectric conversion layer, and a second electrode, in this order, wherein the photoelectric conversion layer satisfies formula (1) below, contains a quantum dot and an organic compound, and the electron affinity of a material used for the first interface layer and the electron affinity of the quantum dot satisfy formula (4) below $$E2 > E1 \quad \text{formula (1)}$$

E1 (eV): energy at a short-wavelength edge in a wavelength region of light detected by the photoelectric conversion element E2 (eV): band gap of the organic compound $$E3 < E4 - 0.2 \quad \text{formula (4)}$$

E3 (eV): electron affinity (eV) of a material used for the first interface layer E4 (eV): electron affinity (eV) of the quantum dot.

Regarding the first interface layer satisfying formula (4), since electrons are not readily accumulated in the photoelectric conversion layer, a dark current is reduced.

Figure 3A:
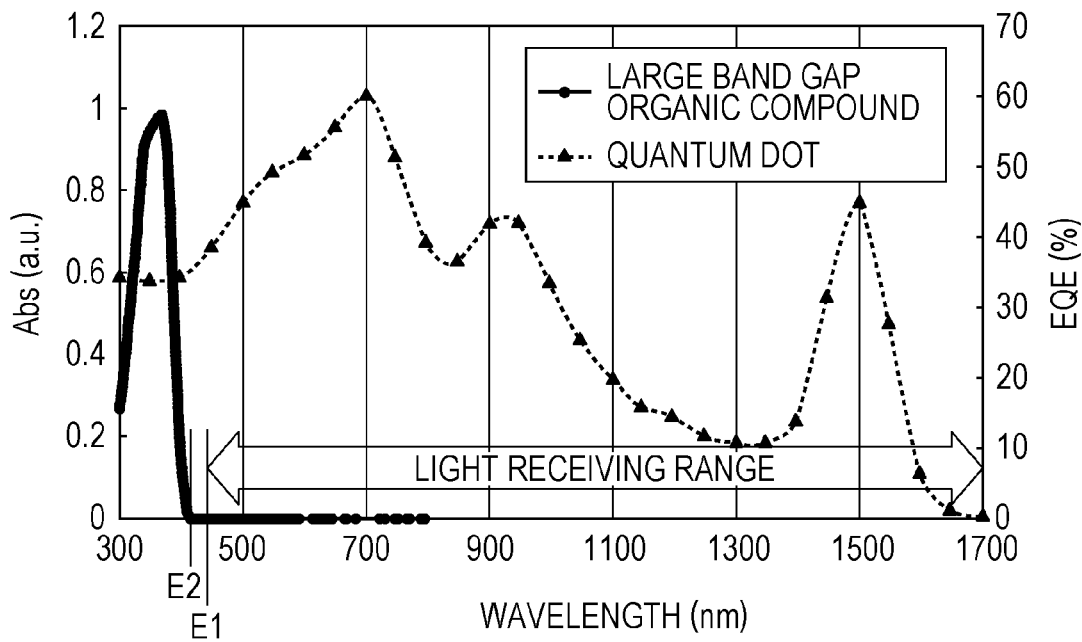
FIGS. 3A and 3B illustrate examples of a photoelectric conversion efficiency spectrum of the quantum dot included in a photoelectric conversion layer and an absorption spectrum of an organic compound.
Figure 3B:
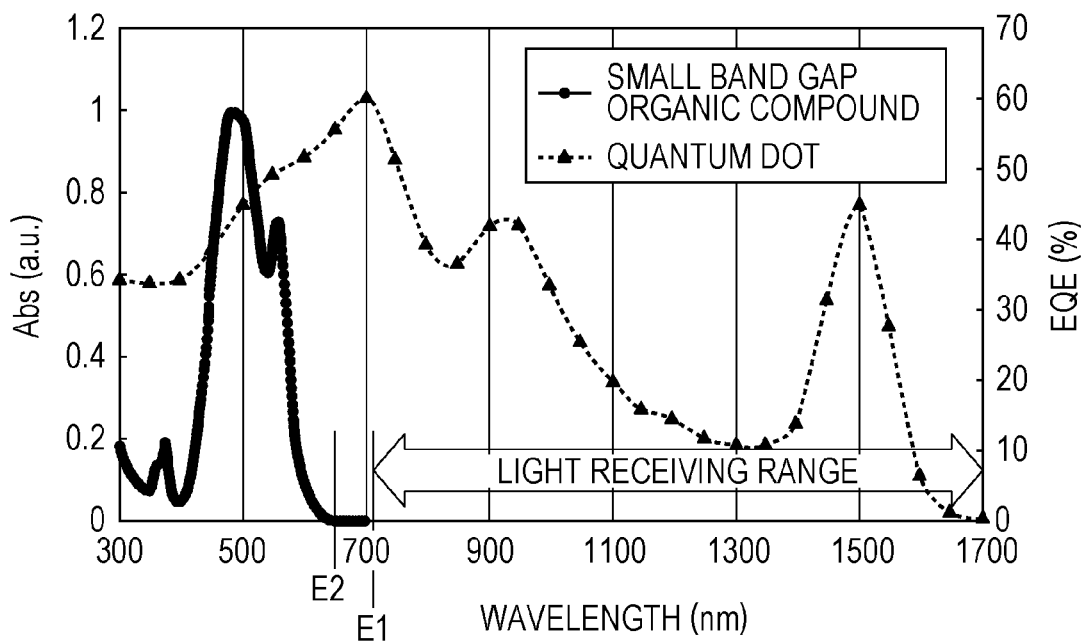

FIGS. 3A and 3B illustrate examples of overwriting a photoelectric conversion efficiency spectrum of the quantum dot included in a photoelectric conversion layer in the present embodiment and an absorption spectrum of the organic compound. In FIGS. 3A and 3B, the positions of the wavelengths corresponding to E1 and E2 In formula (1). The light receiving range of the photoelectric conversion element is freely set in the range from the visible light to the near-infrared light in accordance with use. When the light receiving range is set to be from the visible light region to the near-infrared light region, a compound having a large band gap E2 and exhibiting absorption in only the short-wavelength region is used, as illustrated in FIG. 3A. When the light receiving range is set to be only the near-infrared light region, a compound having a band gap E2 smaller than that illustrated in FIG. 3A and exhibiting absorption in the visible light region may also be used, as illustrated in FIG. 3B. Therefore, wide choices of the compound are provided.

An organic compound having E2 more than 2.9 eV being used enables a photoelectric conversion element exhibiting sensitivity to short-wavelength light to be obtained.

The organic compound can be a compound that does not coordinate with the quantum dot. In general, examples of the compound that coordinates with the quantum dot include compounds having a lone pair of electrons and ionic compounds. These compounds may form a coordination bond by sharing electrons with an element on the surface of the quantum dot. Therefore, The organic compound can be a nonionic compound. In this regard, the compound having a lone pair of electrons can be a compound that is difficult to coordinate with the quantum dot surface due to large steric hindrance around the lone pair of electrons, for example, a tertiary aromatic amine in which the steric hindrance around a nitrogen atom is large. Examples of the organic compound include O-1, O-2 (TFB), O-3, and O-4 (poly-TPD), although the organic compound is not limited to these.

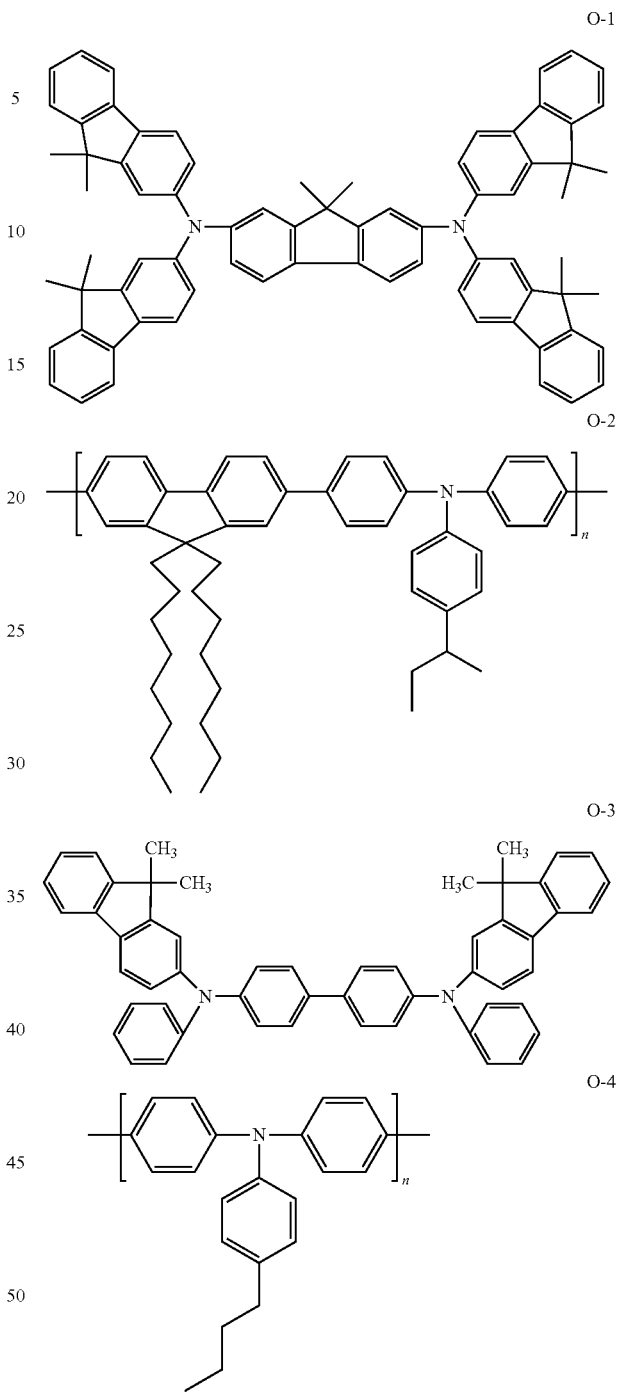

The content of the organic compound is preferably 0.1% by mass or more and less than 10% by mass where the total of the quantum dot and the organic compound in the photoelectric conversion layer is assumed to be 100% by mass.

In this regard, an unreacted organic ligand that did not coordinate during formation of the photoelectric conversion layer and which was not completely washed out may be left. The resulting unreacted organic ligand does not correspond to the organic compound included in the photoelectric conversion layer unless formulae (1), (2), and (3) above are satisfied. For example, 1,4-benzenedithiol and 1,3-benzenedithiol satisfy formula (1) above but do not satisfy formula (2) or formula (3) above. Interface layer (first interface layer 132, second interface layer 134)

The photoelectric conversion apparatus according to the present disclosure can include a first interface layer 132 between the first electrode 131 and the photoelectric conversion layer 133. In addition, a second interface layer 134 can be included between the photoelectric conversion layer 133 and the second electrode 135. The photoelectric conversion apparatus according to the present embodiment includes the first interface layer 132 and the second interface layer 134. The first interface layer 132 may be a hole-blocking interface layer or a hole-blocking layer. The second interface layer 134 may be an electron-blocking interface layer or an electron-blocking layer.

The first interface layer 132 is disposed between the photoelectric conversion layer 133 and a plurality of first electrodes 131. FIG. 1 illustrates two interface layers separated from each other. The second interface layer 134 is disposed between the photoelectric conversion layer 133 and the second electrode 135.

The interface layer is a layer to ensure electrical insulation between the electrode and the photoelectric conversion layer 133 with respect to part of carriers, that is, holes or electrons. The interface layer is a layer to ensure conduction between the electrode and the photoelectric conversion layer 133 with respect to the other carriers. Therefore, the interface layer may also be referred to as a carrier-injection-blocking layer. The interface layer also functions as an adhesion layer and suppresses film delamination that is caused by poor wettability between the electrode and the photoelectric conversion layer 133 from occurring. Therefore, from the viewpoint of suppressing film delamination from occurring, to increase the contact area with the photoelectric conversion layer 133, a film can be formed on the entire surface of the interface layer. Usually, a layer that blocks electrons and conducts just holes (electron-blocking interface layer) may be formed on the electrode that captures holes (positive electrode), and a layer that blocks holes and conducts just electrons (hole-blocking interface layer) may be formed on the electrode that captures electrons (negative electrode).

The function required of the first interface layer 132 (hole-blocking interface layer) is to block holes separated from the photoelectric conversion layer 133 and to transport electrons to the first electrode 131 (negative electrode). Therefore, the material for forming the first interface layer 132 can have properties such as high electron mobility, high electrical conductivity, a low barrier against electron injection to the negative electrode, and a low barrier against electron injection from the photoelectric conversion layer 133 to the hole-blocking interface layer. In addition, a configuration in which light is applied from the negative-electrode side and effective exploitation of the light reflected from the negative-electrode side are also considered, and, in such instances, the transmittance has to be high. The first interface layer 132 being disposed enables the photoelectric conversion efficiency EQE to be improved and enables a dark current to be reduced.

From such a viewpoint, favorable examples of the hole-blocking interface layer material include N-type semiconductor materials of inorganic semiconductors and the like, such as titanium oxide $TiO_2$, zinc oxide ZnO, indium-gallium-zinc oxide IGZO ($InGaZnO_4$), and molybdenum oxide $MoO_3$, and N-type semiconductor materials, such as fullerene C60. In particular, the electrical conductivity of oxide-based inorganic semiconductors is readily changed by controlling the oxidation degree in accordance with the film formation condition or process treatment after film formation.

The material for forming the second interface layer 134 (electron-blocking interface layer) can be a material capable of efficiently transporting holes generated in the photoelectric conversion layer 133 to the second electrode 135 (positive electrode). The material can have properties such as high hole mobility, high electrical conductivity, a low barrier against hole injection to the positive electrode, and a low barrier against hole injection from the photoelectric conversion layer 133 to the electron-blocking interface layer. Further, when light is taken into the photoelectric conversion layer 133 through the electron-blocking interface layer, a material having high transparency can be used as the material for forming the electron-blocking interface layer. When the visible light is taken into the photoelectric conversion layer 133, a material having transmittance of the visible light to be passed of usually 60% or more and, in particular, 80% or more, can be used as the transparent electron-blocking interface layer material. From such a viewpoint, examples of the electron-blocking interface layer material include inorganic semiconductors, such as molybdenum oxide $MoO_3$ and nickel oxide NiO, and organic materials having a triarylamine unit such as a triphenylamine unit or a fluorene unit. The second interface layer 134 being disposed enables the photoelectric conversion efficiency EQE to be improved and enables a dark current to be reduced.

The interface layer is formed to have a film thickness of about 1 nm or more and about 100 nm or less. Regarding the interface layer, injection of the electric charge is controlled by applying an electric field in the film thickness direction, and an electric charge is freely movable in the horizontal direction rather than the film thickness direction. When the electrical conductivity of the interface layer serving as a film is high, a leakage current or crosstalk between unit cells may occur.

Other Layers

In FIG. 1, an insulating layer 136, a color filter layer 137, a planarization layer 138, and a lens layer 139 are disposed in this order on the second electrode layer 135 in the Z-direction. The insulating layer 136 may function as a protective layer or a sealing layer. The color filter layer 137 has a color filter compatible with a plurality of colors. For example, a unit cell 120 includes a color filter. The planarization layer 138 is disposed on the color filter layer 137 and has a flat upper surface. The lens layer 139 has a plurality of micro lenses. For example, a unit cell 120 includes a micro lens. Method for producing photoelectric conversion element and photoelectric conversion apparatus.

The method for producing a photoelectric conversion element and a photoelectric conversion apparatus according to the present embodiment will be described with reference to FIG. 1.

Substrate 100

A step of preparing the substrate 100 provided with a wiring structure 106 will be described. An element isolation portion 113 and a transistor 101 are formed on the substrate 100 serving as a semiconductor substrate. The element isolation portion 113 has, for example, a shallow trench isolation (STI) structure. The transistor 101 is, for example, an N-type MOS transistor and is composed of a gate electrode 104, a gate insulating film 103, a source-drain region 102, and a source-drain region 105. The source-drain regions 102 and 105 are composed of an N-type semiconductor region.

Wiring Structure 106

The wiring structure 106 is formed on the substrate 100. The contact plug 107, the via plug 109, and the via plug 111 are composed of metal, for example, a material selected from Al, Cu, W, Ti, TiN and the like and, in the present embodiment, may have a layered structure of titanium, titanium nitride, and tungsten. The wiring layer 108 and the wiring layer 110 are composed of metal, for example, a material selected from Al, Cu, W, Ti, TiN and the like and, in the present embodiment, may have a layered structure of tantalum and copper.

The insulating film 112 is composed of a film of, for example, silicon oxide or silicon nitride.

First Electrode 131

The first electrode 131 is formed on the via plug 111. The first electrode 131 is formed to have a film thickness of about 10 nm or more and about 500 nm or less. A configuration in which the insulating film 112 is formed after the first electrode 131 is formed may be adopted. In such an instance, planarization treatment is performed so that the upper surface of the insulating film 112 becomes flush with the upper surface of the first electrode 131. The planarization treatment is performed by an etching or chemical mechanical polishing (CMP) method. A common semiconductor process may be applied to these production methods.

First Interface Layer 132

A film serving as the first interface layer 132 is formed on the insulating layer 112 and the first electrode 131. The film serving as the first interface layer 132 is composed of the above-described material deposited by using, for example, a vapor deposition method or a sputtering method so as to have a thickness of about 1 nm or more and about 100 nm or less. The first interface layer 132 having a small film thickness enables a voltage applied to the photoelectric conversion layer 133 to be reduced.

On the other hand, the first interface layer 132 having a large film thickness enables passing through of holes due to an tunnel effect to be reduced and enables film defects such as a pinhole to be suppressed from occurring. For example, setting the film thickness of the first interface layer 132 to be larger than unevenness of the surface of the first electrode 131 enables defects of the first interface layer 132 to be reduced. The film thickness of the first interface layer 132 is appropriately set in consideration of these viewpoints.

Herein, titanium oxide ($TiO_2$) will be described as an example of the material for forming the first interface layer 132. A $TiO_2$ film is formed having a predetermined thickness by using a sputtering apparatus with a $TiO_2$ target at a predetermined RF power, argon gas flow rate, and chamber pressure.

Photoelectric Conversion Layer 133

The photoelectric conversion layer 133 is formed. Specifically, the photoelectric conversion layer 133 is formed by depositing quantum dots that are nanoparticles of a compound semiconductor and the organic compound on the entire substrate surface. Herein, an example in which lead sulfide (PbS) is used as the quantum dot is described. The quantum dot of lead sulfide (PbS) may be synthesized by, for example, the following procedure.

Synthesis Step

Lead oxide (PbO), octadecene, and oleic acid are placed into a three-neck flask, and the flask is set in an oil bath. The oil bath is set at a predetermined temperature, the interior of the flask is set to be in a nitrogen atmosphere, and a nitrogen flow at a predetermined flow rate is set to prevent the quantum dot from being oxidized during the reaction. Stirring is performed until a light yellow solution when being placed into is changed to a transparent solution. Separately, in a glove box in a nitrogen atmosphere, an octadecene solution of bis(trimethyl) silyl sulfide serving as a sulfur source is prepared in a syringe. The resulting sulfur source is rapidly added to the transparent solution in the three-neck flask. After addition, the three-neck flask is removed from the oil bath and left to stand to cool. When room temperature is reached, a purification step is performed thereafter. In this regard, the solution is black so that generation of the quantum dot of lead sulfide (PbS) surface-protected by oleic acid is ascertained.

Purification Step

The quantum-dot-dispersed octadecene solution obtained in the synthesis step is transferred from the three-neck flask to a centrifuge tube. Acetone which is a polar solvent is added to this. Consequently, the quantum dot takes on a state in which stable dispersion in octadecene is difficult, and this is subjected to centrifugal separation by using a centrifuge apparatus so as to precipitate the quantum dot. The centrifuge tube is removed from the centrifuge apparatus, transparent supernatant acetone is discarded, and toluene which is a nonpolar solvent is added to the quantum dot precipitated in the bottom portion of the centrifuge tube. After toluene is added, the quantum dot is redispersed in toluene by shaking the centrifuge tube. Acetone is added again to the quantum-dot-dispersed toluene solution, and centrifugal separation is performed so as to cause precipitation. The quantum-dot-dispersed solution is purified by repeating precipitation by using acetone and redispersion by using toluene three times so as to obtain a quantum-dot-dispersed toluene solution. In this regard, the polar solvent used for precipitating the quantum dot may be methanol or ethanol but can be a material having a small influence on the oleic acid protecting the quantum dot, that is, on elimination from the quantum dot surface.

Step of Forming Coating Liquid

Acetone is added to the quantum-dot-dispersed toluene solution obtained in the purification step, and centrifugal separation is performed so as to cause precipitation as in the purification step. Finally, the quantum dot is redispersed having a predetermined concentration in octane instead of toluene so as to be used as a quantum dot coating liquid.

Step of Forming Quantum Dot Film

The above-described quantum dot coating liquid is dropped on the center of the substrate, and spin coating is performed. Since the quantum dot film after spin coating is assemblies of the quantum dot protected by oleic acid having a large molecular length, the distance between the quantum dots tends to be large, the conductivity of photo-carrier generated by light irradiation tends to be poor, and a photoelectric conversion function tends to be low. Herein, the resulting film is referred to as an "oleic-acid-protected quantum dot film".

Therefore, the ligand can be exchanged from oleic acid to a ligand having a small molecular length. Herein, 1,4-benzenedithiol is used as an organic ligand. An N,N-dimethylformamide solution of 1,4-benzenedithiol is used as a ligand solution for ligand exchange. A halogen (iodine, chlorine, bromine) may be added as an inorganic ligand after ligand exchange by using the organic ligand. For example, an N,N-dimethylformamide solution of lead iodide may be used.

Ligand exchange is performed by coating the oleic-acid-protected quantum dot film formed on the substrate with the above-described ligand solution. Specifically, the entire surface of the oleic-acid-protected quantum dot film is coated with the ligand solution, and a ligand exchange reaction is performed for a predetermined time. The reaction time may be appropriately changed in consideration of the concentration of the ligand solution used. After a predetermined reaction time, the substrate is rotated for a predetermined time so as to shake off the liquid and to dry. After the ligand exchange, to remove an excess ligand remaining on the film, rinse with acetonitrile or methanol which is a solvent to dissolve the ligand is performed. Further, to remove oleic acid eliminated from the quantum dot, rinse with octane is performed. As a result, oleic acid of the oleic-acid-protected quantum dot film is eliminated and is exchanged to a predetermined ligand, and 1,4-benzenedithiol-quantum-dot film is formed. In such an instance, the film thickness of the 1,4-benzenedithiol-quantum-dot film after the ligand exchange is 40 nm or more and 60 nm or less.

In this regard, the organic ligand is not limited to 1,4-benzenedithiol and may be at least one ligand selected from ligands of, for example, organic compounds including ethanedithiol, 1,3-benzenedithiol, 4-methylbenzoic acid, benzenediamine, and dibenzenediamine. In particular, since the ligands having a benzene ring, such as benzenedithiol, have a boiling temperature higher than 200° C., the ligand is suppressed from elimination-decomposing and vaporizing from the quantum dot surface even at a high temperature of 140° C. or higher, and the quantum dot film has high heat resistance. Ligands such as 3-mercaptopropionic acid may be selected, but ligands having a benzene ring can be adopted from the viewpoint of heat resistance.

After the ligand exchange by using the organic ligand, in the ligand exchange procedure akin to that described above, coordination of the iodine ligand with the quantum dot and addition of the organic compound to the photoelectric conversion layer are performed by using an N,N-dimethylformamide mixture solution of lead iodide and the organic compound. The organic compound may be added separately from coordination of the iodine ligand.

An iodine-added 1,4-benzenedithiol-quantum-dot film having a predetermined film thickness is formed by repeating again, on the quantum dot film (thickness of 40 nm to 60 nm) after the ligand exchange, formation of an oleic-acid-protected quantum dot film, ligand exchange, addition of an organic compound, and rinse.

Second Interface Layer 134

A film serving as the second interface layer 134 is formed on the photoelectric conversion layer 133. The film serving as the second interface layer 134 is composed of the above-described material deposited by using, for example, a vapor deposition method or a sputtering method so as to have a thickness of about 1 nm or more and about 100 nm or less. The second interface layer 134 having a small film thickness enables a voltage applied to the photoelectric conversion layer 133 to be reduced. On the other hand, the second interface layer 134 having a large film thickness enables passing through of electrons due to an tunnel effect to be reduced and enables film defects such as a pinhole to be suppressed from occurring. For example, setting the film thickness of the second interface layer 134 to be larger than unevenness of the surface of the second electrode 135 enables defects of the second interface layer 134 to be reduced. The film thickness of the second interface layer 134 is appropriately set in consideration of these viewpoints.

Second electrode 135

Thereafter, the second electrode 135 is formed. In detail, the second electrode 135 is formed by depositing ITO, IZO, ZnO, or the like on the second interface layer 134.

Annealing Treatment

The formed device is subjected to annealing treatment to improve the photoelectric conversion efficiency and to improve carrier injection. The annealing temperature is determined in accordance with the heat resistance of the material used for each layer and can be lower than the lowest glass transition temperature of the glass transition temperatures of the organic compounds used. In addition, to be provided with sufficient durability against the temperature which may be applied in each process, the glass transition temperature of the organic compound is desirably 100° C. or higher.

Other Layers

Subsequently, the insulating layer 136, the color filter layer 137, the planarization layer 138, and the lens layer 139 are formed successively. A common method for forming a semiconductor device may be applied to the methods for forming these.

Regarding Evaluation of Residual Image

A residual image is a phenomenon in which electric charge is not completely transferred by once scanning and remains in the next scanning. It is difficult to follow rapid change in the intensity of the incident light, and tailing is observed in the image by actual video shooting. Therefore, the residual image has to be minimized. Whether the residual image is caused due to the structure of the photoelectric conversion element interposed between the second electrode 135 and the first electrode 131 in the photoelectric conversion apparatus is evaluated by measuring the transient response of the current value, as described below.

Figure 4A:
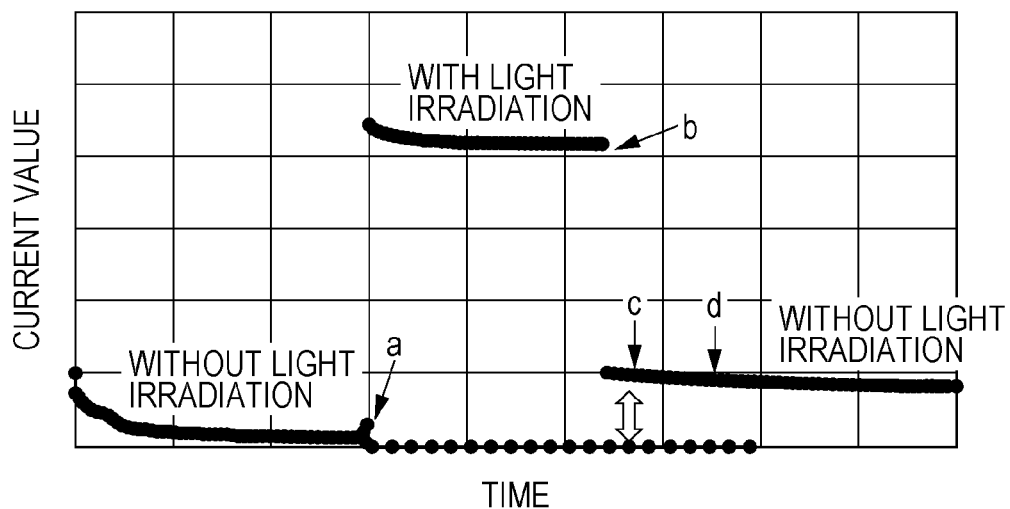
FIGS. 4A and 4B illustrate measurement examples of photocurrent transient response of a photoelectric conversion element with or without light irradiation.
Figure 4B:
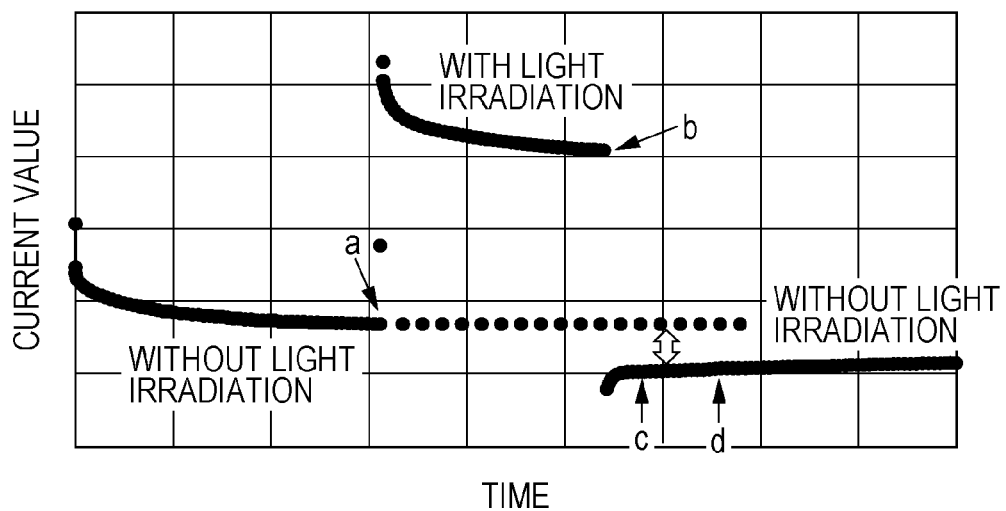

FIGS. 4A and 4B illustrate measurement examples of transient response of a photoelectric conversion element with or without light irradiation. Initially, the value of a dark current when voltage application is performed in the state without light irradiation for a predetermined time until the dark current is stabilized is assumed to be a. Subsequently, light irradiation is performed and the value of photocurrent after a lapse of a predetermined time is assumed to be b. Thereafter, the light is turned off, and the value of dark current after a lapse of a short time is assumed to be c and after a lapse of some time is assumed to be d.

In the present disclosure, the residual image is quantified by using formula (4) below.

$$\text{residual image } (\%) = |\{(c \text{ or } d) - a\}|/|(b-a)| \quad (4)$$

In FIGS. 4A and 4B, the current indicated by a "double-headed arrow (⇔)" corresponds to an observed residual image. The residual image is divided into two types, that is, "luminance increment" in which a dark current immediately after completion of light irradiation increases compared with an initial dark current, as illustrated in FIG. 4A, and "darkening" in which a dark current immediately after completion of light irradiation decreases compared with an initial dark current, as illustrated in FIG. 4B.

Figure 5:
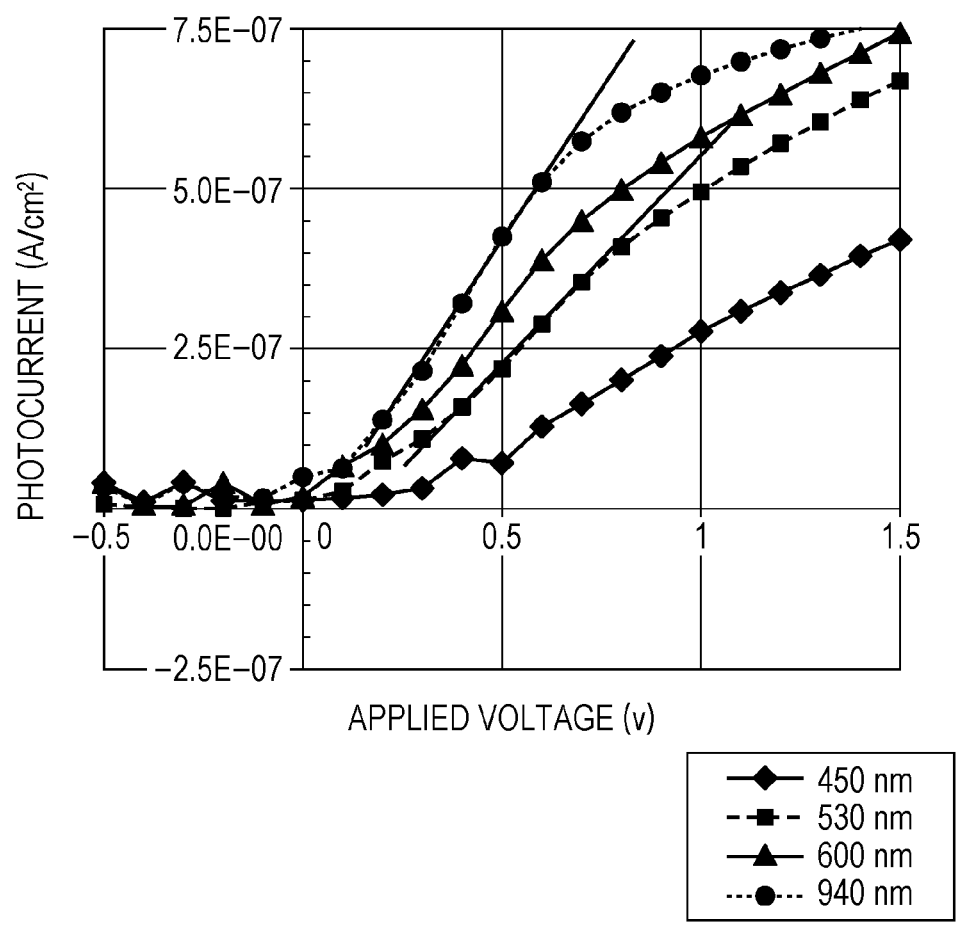
FIG. 5 illustrates voltage-current curves of a photoelectric conversion element at various wavelengths of irradiation light.

The applied voltage during the transient response measurement is desirably a maximum voltage applied between the electrodes when the photoelectric conversion apparatus is actuated, and there is a lower limit value. FIG. 5 illustrates voltage-current curves of a main photoelectric conversion element at various wavelengths of irradiation light. The voltage-current curve rises and is saturated, and the point at which the gradient of the curve begins to reduce is the lower limit value. The lower limit value changes in accordance with the irradiation wavelength, and to include all of them, the lower limit value is desirably 1 V.

Application Examples of Photoelectric Conversion Element
Photoelectric Conversion Apparatus such as Light Receiving Element and Image Sensor The photoelectric conversion element according to an embodiment of the present disclosure may be used for photoelectric conversion apparatuses such as light receiving elements and image sensors. The light receiving element includes a photoelectric conversion element, a reading circuit to read an electric charge from the photoelectric conversion element, and a signal processing circuit to receive an electric charge from the reading circuit and to perform signal processing. The image sensor includes a plurality of pixels and the signal processing circuit connected to the pixels. The pixel includes the photoelectric conversion element and the reading circuit connected to the photoelectric conversion element.

Imaging Apparatus

The photoelectric conversion element according to an embodiment of the present disclosure may be used for an imaging apparatus. The imaging apparatus includes an optical system having a plurality of lenses and a light receiving element to receive light passed through the optical system, and the light receiving element includes a photoelectric conversion element. The imaging apparatus may be specifically a digital still camera, or a digital video camera.

FIG. 6 is a diagram illustrating an example of an imaging system by using the photoelectric conversion element according to an embodiment of the present disclosure. As illustrated in FIG. 6, an imaging system 200 includes a photoelectric conversion apparatus 201, an imaging optical system 202, a CPU 210, a lens control portion 212, a photoelectric conversion apparatus control portion 214, an image processing portion 216, an aperture shutter control portion 218, a display portion 220, an operation switch 222, and a recording medium 224.

The imaging optical system 202 is an optical system to form an optical image of a subject and includes a lens group, an aperture 204, and the like. The aperture 204 has a function of controlling the amount of the light during imaging by adjusting the opening diameter and, in addition, also has a function of an exposure time adjustment shutter during imaging of a still image. The lens group and the aperture 204 are held movably in the optical axis direction, and a scaling function (zoom function) and a focusing function are realized by operative association of these. The imaging optical system 202 may be integrated with the imaging system or be an imaging lens attachable to the imaging system.

The photoelectric conversion apparatus 201 is disposed with the imaging surface thereof being located in the image space of the imaging optical system 202. The photoelectric conversion apparatus 201 is the photoelectric conversion apparatus according to an embodiment of the present disclosure and is configured to include a CMOS sensor (pixel portion) and a peripheral circuit (peripheral circuit region) thereof. The photoelectric conversion apparatus 201 constitutes a two-dimensional single-chip color sensor by a plurality of pixels having a photoelectric conversion portion being two-dimensionally arranged and a color filter being arranged with respect to these pixels. The photoelectric conversion apparatus 201 performs photoelectric conversion of a subject image which is imaged by the imaging optical system 202 and outputs an image signal or a focal point detection signal.

The lens control portion 212 controls a moving operation of the lens group of the imaging optical system 202 so as to perform scaling operation and focusing and is composed of a circuit and a processing device configured to realize the function. The aperture shutter control portion 218 changes the opening diameter of the aperture 204 (aperture value is variable) so as to adjust the amount of imaging light and is composed of a circuit and a processing device configured to realize the function.

The CPU 210 is a control apparatus in a camera to govern various control of the camera main body and includes a computation portion, ROM, RAM, an A/D converter, a D/A converter, a communication interface circuit, and the like. The CPU 210 controls the action of each portion in the camera in accordance with the computer programs stored in ROM and the like so as to perform a series of imaging actions such as AF including detection of a focusing state of the imaging optical system 202 (focal point detection), imaging, image processing, and recording. The CPU 210 is also a signal processing portion.

The photoelectric conversion apparatus control portion 214 controls the action of the photoelectric conversion apparatus 201, subjects the signal output from the photoelectric conversion apparatus 201 to A/D conversion so as to send to the CPU 210, and is composed of a circuit and a processing device configured to realize the functions. The photoelectric conversion apparatus 201 may be provided with the A/D conversion function. The image processing portion 216 forms an image signal by performing image processing such as γ conversion and color interpolation with respect to the signal subjected to A/D conversion and is composed of a circuit and a processing device configured to realize the function. The display portion 220 is a display device such as a liquid crystal display device (LCD) and displays the information related to the imaging mode of the camera, a preview image before imaging, a check image after imaging, a focusing state during focal point detection, and the like. The operation switch 222 is composed of a power supply switch, a release (imaging trigger) switch, a zoom operation switch, an imaging mode selection switch, and the like. The recording medium 224 records imaged image and the like, may be incorporated in the imaging system, and may be a removable medium such as a memory card.

In this manner, formation of the imaging system 200 to which the photoelectric conversion apparatus 201 according to an embodiment of the present disclosure is applied enables a high-performance imaging system to be realized.

Mobile Unit

The photoelectric conversion element according to an embodiment of the present disclosure may be used for a mobile unit. The mobile unit includes a bodywork provided with the imaging apparatus and a moving unit to move the bodywork. Specific examples include automobiles, aircraft, ships, and drones. The circumstances are imaged and the operation of the mobile unit may be supported by the imaging apparatus being disposed on the mobile unit. The bodywork may be formed of metal or carbon fiber. Polycarbonates and the like may be used as the carbon fiber. Examples of the moving unit include tires, magnetic levitation, and a mechanism to vaporize and eject a fuel.

Figure 7A:
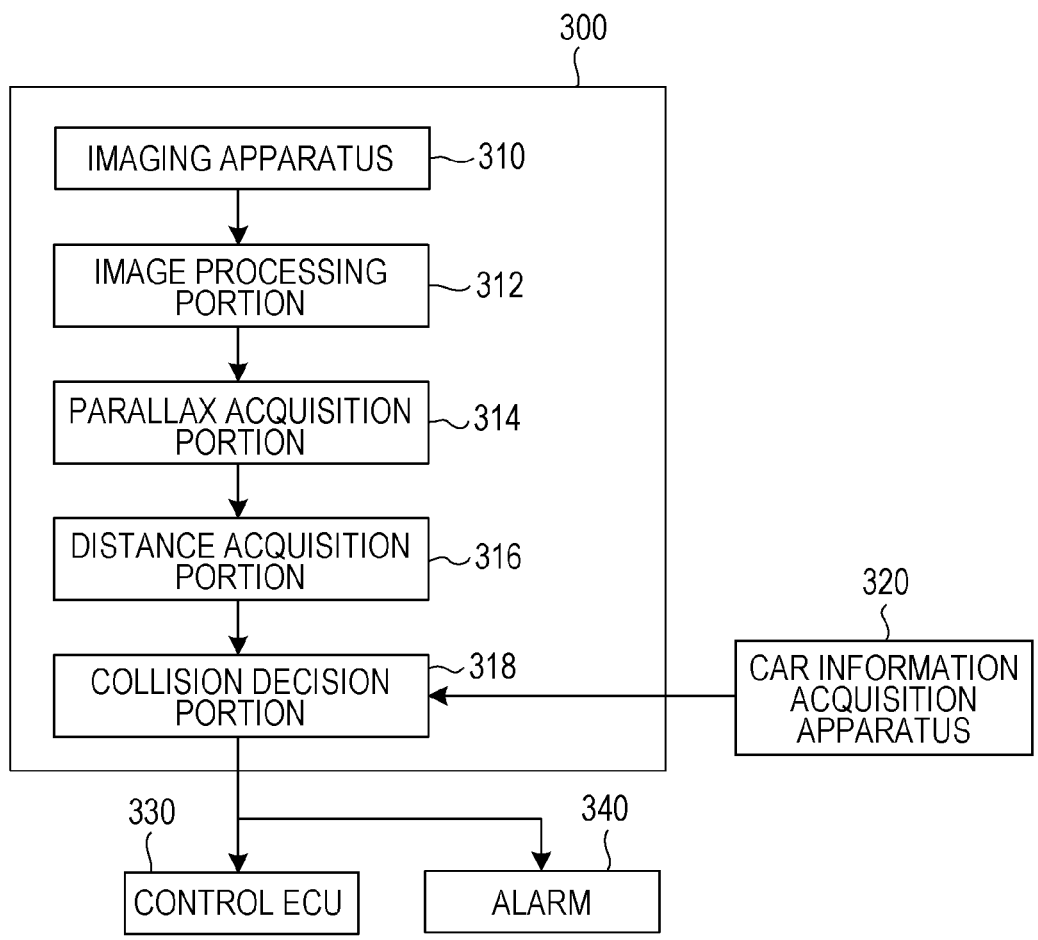
FIGS. 7A and 7B are diagrams illustrating the configuration of an imaging system and a mobile unit according to the present embodiment.
Figure 7B:
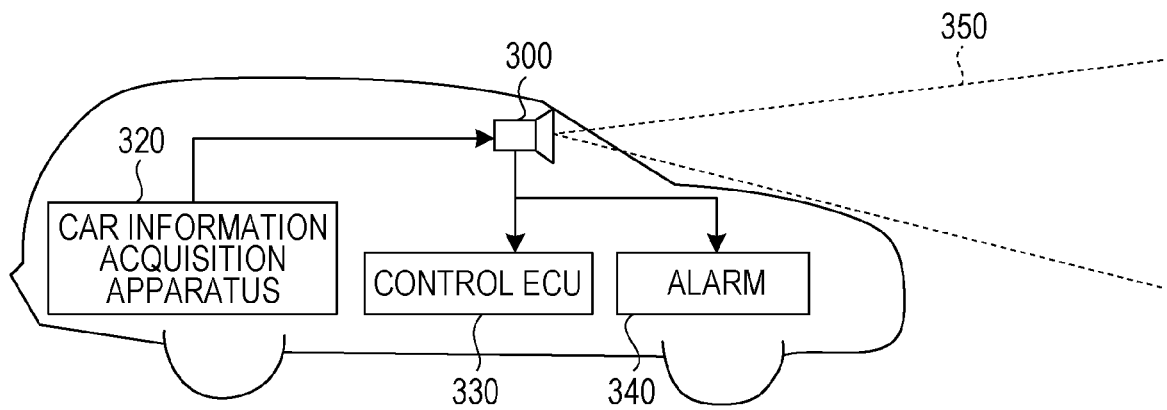

FIG. 7A and FIG. 7B are diagrams illustrating the configuration of an imaging system and a mobile unit according to the present embodiment.

FIG. 7A illustrates an example of an imaging system 300 with respect to a car-mounted camera. The imaging system 300 includes an imaging apparatus 310. The imaging apparatus 310 is the imaging apparatus described in the present embodiment. The imaging system 300 includes an image processing portion 312 that is a processing apparatus to perform image processing with respect to a plurality of image data acquired by the imaging apparatus 310. In addition, the imaging system 300 includes a parallax acquisition portion 314 that is a processing apparatus to calculate parallax (phase difference of parallax image) from the plurality of image data acquired by the imaging apparatus 310. Further, the imaging system 300 includes a distance acquisition portion 316 that is a processing apparatus to calculate the distance to the subject on the basis of the calculated parallax and a collision decision portion 318 that is a processing apparatus to determine whether there is a possibility of collision on the basis of the calculated distance. In this regard, the parallax acquisition portion 314 and the distance acquisition portion 316 are examples of information acquisition devices to acquire information such as distance information with respect to a subject. That is, the distance information is information with respect to the parallax, the amount of defocus, the distance to a subject, and the like. The collision decision portion 318 may determine a collision possibility by using any one of the distance information. The above-described various processing apparatuses may be realized by using specifically designed hardware or may be realized by using general-purpose hardware that performs computation on the basis of software modules. The processing apparatuses may be realized by Field Programmable Gate Array (FPGA), Application Specific Integrated Circuit (ASIC), and the like or may be realized by combining these.

The imaging system 300 is connected to a car information acquisition apparatus 320 and is capable of acquiring car information such as a car speed, a yaw rate, a rudder angle, and the like. In addition, the imaging system 300 is connected to a control ECU 330 that is a control apparatus to output a control signal for generating a braking force with respect to a car on the basis of the decision result of the collision decision portion 318. That is, the control ECU 330 is an example of mobile unit control devices to control a mobile unit on the basis of the distance information. Further, the imaging system 300 is also connected to an alarm 340 that gives an alarm to a driver on the basis of the decision result of the collision decision portion 318. For example, when a collision possibility is high as a result of the decision of the collision decision portion 318, the control ECU 330 performs car control to avoid collision and reduce damage by applying brakes, releasing the accelerator, reducing an engine output, and so forth. The alarm 340 gives an alarm to a user by generating, for example, an audible alarm, displaying alarm information on a screen of car navigation system or the like, vibrating a seat belt or steering, and so forth.

In the present embodiment, the circumferences of a car, for example, the front or the rear, are imaged by using the imaging system 300.

FIG. 7B illustrates the imaging system 300 when imaging the front of a car (imaging range 350).

The car information acquisition apparatus 320 sends an order to operate the imaging system 300 and to perform imaging. The accuracy of distance measurement of the imaging system 300 according to the present embodiment is improved by using the imaging apparatus according to the present embodiment as the imaging apparatus 310.

The example in which control is performed so as to avoid collision with another car is described above. The imaging system may also be applied to, for example, control in which automatic operation following another car is performed and control in which automatic operation is performed without straying from the traffic lane. Further, the imaging system may be applied to mobile units (transportation apparatuses), for example, ships, aircraft, and industrial robots, not limited to vehicles such as automobiles. The moving apparatuses in the mobile units (transportation apparatuses) are various moving units such as engines, motors, wheels, and propellers.

In addition, the imaging system may be widely applied to equipment exploiting object recognition, for example, the intelligent transport system (ITS), not limited to the mobile unit.

EXAMPLES

The example according to the present disclosure will be described below, but the present disclosure is not limited to the range described in the example. In the present example, the following photoelectric conversion element was fabricated, and element characteristics were evaluated. In this regard, the present example is to clarify the effect of the reduction in dark current and residual image by evaluating the characteristics of the element based on various combinations. Therefore, since the material, the film thickness, and the layer configuration of each layer in the element described below are just examples, the present disclosure is not limited to just the example disclosed here.

Example 1

A photoelectric conversion element in the present example was formed by stacking an electron-capturing electrode (first electrode), a hole-blocking layer (first interface layer), a photoelectric conversion layer, an electron-blocking layer (second interface layer), and a hole-capturing electrode (second electrode) in this order on a Si substrate. The light receiving range was set to be 450 nm to 1,700 nm. That is, the energy E1 at a short-wavelength edge (450 nm) in a wavelength region of the light detected by the photoelectric conversion element was 2.76 eV. In this regard, the ionization potential ($Ip_{QD}$) of the quantum dot used in the present example was 5.3 eV.

The Si substrate on which a wiring layer and an insulating layer were stacked where the insulating layer had an opening and a contact hole was formed in a portion corresponding to each pixel so that electrical connection was ensured was prepared. A wiring line was extended from the contact hole to the substrate edge and a pad portion was formed. A TiN electrode film was formed covering the contact hole portion, and predetermined patterning was performed so as to form a TiN electrode (electron-capturing electrode) of 0.64 mm$^2$. At this time, the film thickness of the TiN electrode was set to be 60 nm.

An element was fabricated on the basis of the constituent materials and film thicknesses described in Table 1 in the above-described order on the Si substrate provided with the electron-capturing electrode. The resulting element was subjected to annealing treatment at 100° C. for 1 hour.

TABLE 1

| | Constituent material | Film thickness [nm] |
|---|---|---|
| Electron-capturing electrode | TiN | 60 |
| Hole-blocking layer | TiO$_2$ | 50 |
| Photoelectric conversion layer | nanoparticle:PbS ligand:1,4-benzenedithiol, PbI$_2$ organic compound:0-1 | 200 |
| Electron-blocking layer | MoO$_3$ | 15 |
| Hole-capturing electrode | ITO | 40 |

The specific methods for producing the hole-blocking layer, the photoelectric conversion layer, the electron-blocking layer, and the hole-capturing electrode are as described below.

Hole-Blocking Layer (First Interface Layer)

A $TiO_2$ film having a thickness of 50 nm was formed by using a sputtering apparatus and a $TiO_2$ target under the conditions of an RF power of 500 W, an argon gas of 100 sccm, and a chamber pressure of 0.5 Pa.

Photoelectric Conversion Layer

Synthesis Step

A three-neck flask was charged with 892 mg of lead oxide (PbO), 40 mL of octadecene, and 4 mL of oleic acid, and the flask was set in an oil bath. The set temperature of the oil bath was 90° C., the interior of the flask was set to be in a nitrogen atmosphere, and a nitrogen flow was set at a flow rate of 0.5 L/min to prevent the quantum dot from being oxidized during the reaction. Stirring was performed for 30 min or more until a light yellow solution when being placed into was changed to a transparent solution. Separately, in a glove box in a nitrogen atmosphere, 20 mL of octadecene solution of 1.9-mM bis(trimethyl) silyl sulfide serving as a sulfur source was prepared in a syringe. The resulting sulfur source was rapidly added to the transparent solution in the three-neck flask. After a lapse of 1 min from addition, the three-neck flask was removed from the oil bath and left to stand to cool for 2 hours. When room temperature was reached, a purification step was performed thereafter. In this regard, the solution was black so that generation of the quantum dot of lead sulfide (PbS) surface-protected by oleic acid was ascertained.

Purification Step

The quantum-dot-dispersed octadecene solution obtained in the synthesis step was transferred from the three-neck flask to a centrifuge tube. Acetone which is a polar solvent was added to this. Consequently, the quantum dot took on a state in which stable dispersion in octadecene was difficult, and this was subjected to centrifugal separation by using a centrifuge apparatus so as to precipitate the quantum dot. The centrifugal separation condition was 17,000 rpm for 20 min. The centrifuge tube was removed from the centrifuge apparatus, transparent supernatant acetone was discarded, and toluene which is a nonpolar solvent was added to the quantum dot precipitated in the bottom portion of the centrifuge tube. After toluene was added, the quantum dot was redispersed in toluene by shaking the centrifuge tube. Acetone was added again to the quantum-dot-dispersed toluene solution, and centrifugal separation was performed at 15,000 rpm for 5 min so as to cause precipitation. The quantum-dot-dispersed solution was purified by repeating precipitation by using acetone and redispersion by using toluene three times so as to obtain a quantum-dot-dispersed toluene solution.

Step of Forming Coating Liquid

Acetone was added to the quantum-dot-dispersed toluene solution obtained in the purification step, and centrifugal separation was performed so as to cause precipitation as in the purification step. Finally, the quantum dot was redispersed having a concentration of 80 mg/mL in octane instead of toluene so as to be used as a quantum dot coating liquid.

Step of Forming Quantum Dot Film

Initially, 1 mL of the above-described quantum dot coating liquid was dropped on the center of the substrate, and spin coating was performed under the spin coating condition of 2,500 rpm for 30 sec. The quantum dot film after spin coating was an oleic-acid-protected quantum dot film (assemblies of the quantum dot protected by oleic acid having a large molecular length).

Subsequently, the ligand was exchanged from oleic acid to a ligand having a small molecular length. Herein, 1,4-benzenedithiol was used as an organic ligand. An N,N-dimethylformamide solution of 3-mM 1,4-benzenedithiol was used as a ligand solution for ligand exchange.

The entire surface of the oleic-acid-protected quantum dot film was coated with 20 mL of the ligand solution, and a ligand exchange reaction was performed for 30 sec. Thereafter, the substrate was rotated at 2,000 rpm for 60 sec so as to shake off the liquid and to dry. After the ligand exchange, to remove an excess ligand remaining on the film, rinse with acetonitrile or methanol which is a solvent to dissolve the ligand was performed. Further, to remove oleic acid eliminated from the quantum dot, rinse with octane was performed. As a result, oleic acid of the oleic-acid-protected quantum dot film was eliminated and was exchanged to a predetermined ligand, and 1,4-benzenedithiol-quantum-dot film was formed. In such an instance, the film thickness of the 1,4-benzenedithiol-quantum-dot film after the ligand exchange was 40 nm or more and 60 nm or less.

After the ligand exchange by using the organic ligands, in the ligand exchange procedure akin to that described above, coordination of the iodine ligand with the quantum dot and addition of the organic compound to the photoelectric conversion layer were performed by using 20 mL of N,N-dimethylformamide mixture solution of lead iodide and the organic compound (10 mM lead iodide, 5 mg/mL organic compound).

An iodine-added 1,4-benzenedithiol-quantum-dot film having a predetermined film thickness was formed by repeating again, on the quantum dot film (thickness of 40 nm to 60 nm) after the ligand exchange, formation of an oleic-acid-protected quantum dot film, ligand exchange, addition of an organic compound, and rinse. In this regard, in the present example, this was repeated four times so as to form a quantum dot film (thickness of 200 mm) corresponding to four layers.

Electron-Blocking Layer (Second Interface Layer)

A $MoO_3$ film having a thickness of 15 nm was formed by using a vapor deposition apparatus under the condition of a chamber pressure of $2.0 \times 10^{-4}$ Pa.

Hole-Capturing Electrode (Second Electrode)

An ITO film having a thickness of 40 nm was formed by using a sputtering apparatus and an ITO target under the conditions of DC 400 V, an argon gas of 300 sccm, and a chamber pressure of 0.5 Pa.

External Quantum Efficiency and Number of Dark Electrons

The fabricated element was used, and the external quantum efficiency (EQE) and the number of dark electrons were measured. Semiconductor Parameter Analyzer (4156B, fabricated by Agilent) was used for applying the voltage and measuring the current. A high-precision spectrometer VC-250CA2 fabricated by Bunkoukeiki Co., Ltd., was used for light irradiation.

Figure 8:
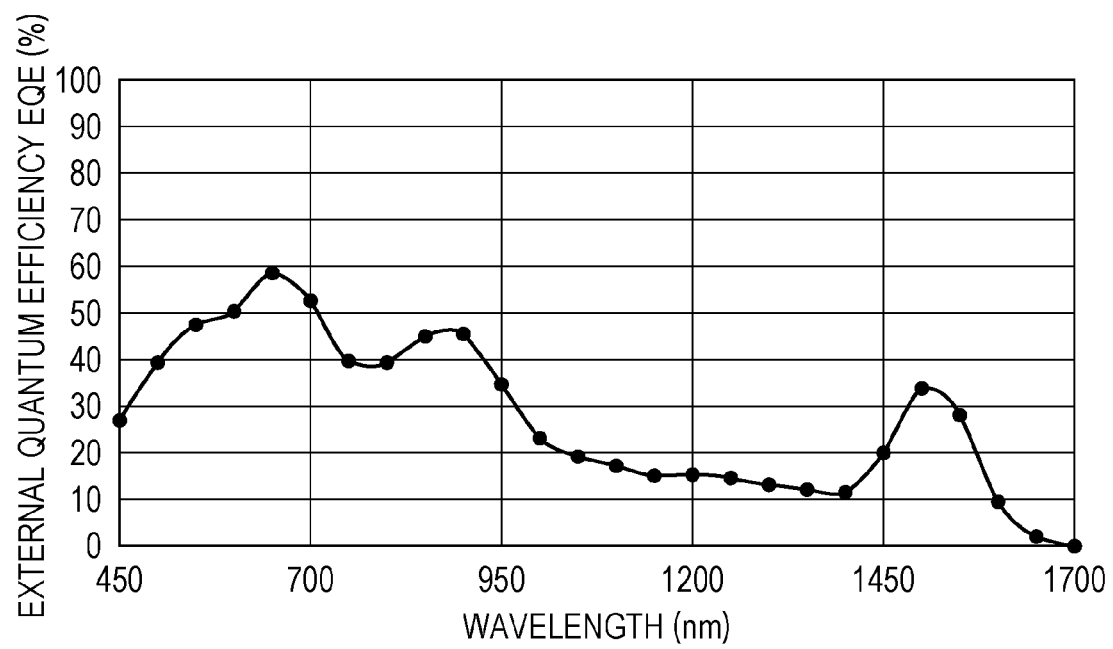
FIG. 8 is a diagram illustrating an example of external quantum efficiency of a photoelectric conversion element fabricated according to the present embodiment.

FIG. 8 is a diagram illustrating the external quantum efficiency of the photoelectric conversion element fabricated according to the present example.

The unit of the number of dark electrons (25° C.) is /sec·μm².

Both the external quantum efficiency and the number of dark electrons were evaluated at an applied voltage of 2 V.

In this regard, the criteria of the evaluation of the number of dark electrons were as described below, ratings of AA and A were specified to be good, and ratings B and C were specified to be poor.

AA: less than 20,000/sec·μm²
A: 20,000/sec·μm² or more and less than 50,000/sec·μm²
B: 50,000/sec·μm² or more and less than 100,000/sec·μm²
C: 100,000/sec·μm² or more Evaluation of Residual Image The fabricated element was used, and the transient response of device with or without light irradiation was measured. Regarding the measurement condition, voltage application was performed in the state without light irradiation for 5 min from start of voltage application, light irradiation was performed for 4 min, and an elapsed time after the light was turned off again was set to be 1 min. The applied voltage was set to be 3 V. In formula (4) above, c was set to be 10 sec after, and d was set to be 60 sec after. Semiconductor Parameter Analyzer (4156B, fabricated by Agilent) was used for applying the voltage and measuring the current. A surface emitting white LED (TH-100X100SW fabricated by CCS Inc.) was used for light irradiation.

In this regard, the criteria of the evaluation of the residual image were as described below, ratings of AA and A were specified to be good, and ratings B and C were specified to be poor.
- AA: residual images 10 sec after and 60 sec after the light was turned off were less than 3%
- A: residual images 10 sec after and 60 sec after the light was turned off were 3% or more and less than 5%
- B: residual images 10 sec after and 60 sec after the light was turned off were 5% or more and less than 8%
- C: residual images 10 sec after and 60 sec after the light was turned off were 8% or more Examples 2 to 4

Photoelectric conversion elements were fabricated and evaluated as in example 1 except that the organic compound contained in the photoelectric conversion layer was changed as described in Table 2. The results are described in Table 2. The compounds used in comparative examples 2 to 5 are as described below.

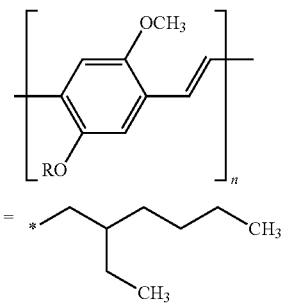

O-6

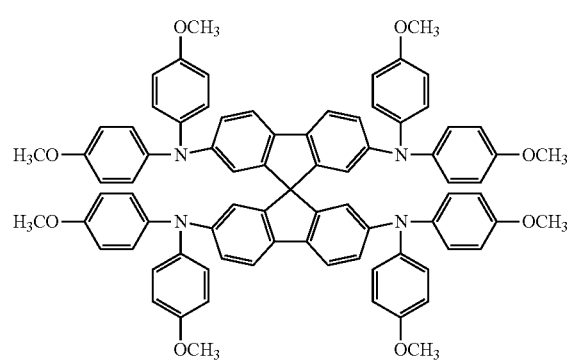

O-7

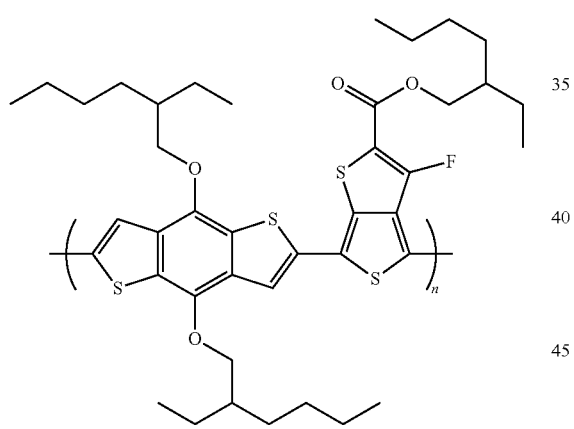

O-5

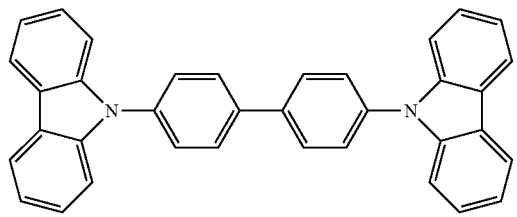

O-8

TABLE 2

| | | Organic compound | | | | EQE | Number | |
| | | Species | E2 [eV] | $\mu h_{org}$ [cm$^2$/Vs] | $Ip_{org}$ [eV] | $\mu h_{org}/\mu h_{QD}$ | (1500 nm) [%] | of dark electrons | Residual image |
|---|---|---|---|---|---|---|---|---|---|
| Example | 1 | O-1 | 3.1 | 1.1E−02 | 5.2 | 275 | 35 | AA | AA |
| | 2 | O-2 | 3.0 | 5.0E−03 | 5.3 | 125 | 34 | AA | AA |
| | 3 | O-3 | 3.0 | 1.2E−03 | 5.4 | 30 | 32 | A | A |
| | 4 | O-4 | 2.9 | 1.0E−04 | 5.2 | 2.5 | 32 | A | A |
| Comparative example | 1 | — | — | — | — | — | 30 | C | C |
| | 2 | O-5 | 1.8 | 1.0E−03 | 5.1 | 25 | 18 | C | B |
| | 3 | O-6 | 2.4 | 3.0E−05 | 5.1 | 0.8 | 21 | C | C |
| | 4 | O-7 | 3.0 | 3.0E−05 | 5.1 | 0.8 | 28 | B | C |
| | 5 | O-8 | 3.1 | 2.0E−03 | 6.0 | 50 | 31 | B | B |

Examples 1 to 4 are examples in which organic compounds satisfying formulae (1), (2), and (3) are used. That is, regarding organic compounds O-1 to O-4, E2>2.76 eV (E1), $\mu h_{org}/\mu h_{QD}<1$, and $Ip_{org} \leq 5.5$ eV ($Ip_{QD}$(5.3 eV)+0.2) are satisfied.

Regarding the characteristics in examples 1 to 4, ratings of all the number of dark electrons and the residual image are AA or A. The photoelectric conversion efficiency (EQE) is also improved. When the ratio $\mu h_{org}/\mu h_{QD}$ of the hole mobility of the organic compound ($\mu h_{org}$) to the hole mobility of the quantum dot ($\mu h_{QD}$) increases, evaluation values of the number of dark electrons and the residual image tend to be further improved.

In addition, examples 1 to 4 are examples that satisfy formula (1) and formula (4). Since the electron affinity of PbS is 4.4 eV and examples 1 to 4 satisfy E3<4.2 eV, formula (4) is satisfied and a dark current is reduced.

Regarding comparative example 1, the organic compound is not added, and a reduction in the number of dark electrons and the residual image is not observed.

Comparative examples 2 and 3 are examples in which the organic compound that does not satisfy formula (1) is used and examples in which the absorption range of the organic compound is within the light receiving range of the photoelectric conversion element. Regarding comparative examples 2 and 3, trapping of electric charge and recombination of the quantum dot having low energy tend to occur, a reduction in dark current and residual image is not observed, and the photoelectric conversion efficiency is reduced.

Comparative example 4 is an example in which the organic compound that satisfies formula (1) but does not satisfy formula (2) is used.

The quantum dot is dispersed and the number of dark electrons is somewhat reduced due to addition of the organic compound. However, since the hole transportability is poor, an effect of improving the residual image is limited.

Comparative example 5 is an example in which the organic compound that satisfies formula (1) but does not satisfy formula (3) is used.

Organic compound O-8 has an absolute value of the HOMO level ($Ip_{org}$) lower than the HOMO level of the quantum dot ($Ip_{QD}$)+0.2 (eV). Therefore, there is no contribution to an improvement of the hole transportability in the photoelectric conversion layer, and an effect of improving a dark current and a residual image is not sufficiently obtained.

According to the present disclosure, a photoelectric conversion element and a photoelectric conversion apparatus in which a dark current and a residual image are reduced are provided.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-005752 filed Jan. 18, 2021 and No. 2021-205143 filed Dec. 17, 2021, which are hereby incorporated by reference herein in their entirety.

What is claimed is:

1. A photoelectric conversion element comprising:
   a first electrode;
   a photoelectric conversion layer; and
   a second electrode, in this order,
   wherein the photoelectric conversion layer contains a quantum dot and an organic compound and
   satisfies formulae (1), (2), and (3), $$E2>E1 \qquad \text{formula (1)}$$

E1 (eV): energy at a short-wavelength edge in a wavelength region of light detected by the photoelectric conversion element
E2 (eV): band gap of the organic compound $$\mu h_{org} > \mu h_{QD} \qquad \text{formula (2)}$$

$\mu h_{org}$ (cm$^2$/Vs): hole mobility of the organic compound in the photoelectric conversion layer
$\mu h_{QD}$ (cm$^2$/Vs): hole mobility of the quantum dot in the photoelectric conversion layer $$Ip_{org} \leq Ip_{QD}+0.2 \qquad \text{formula (3)}$$

$Ip_{org}$ (eV): ionization potential of the organic compound
$Ip_{QD}$ (eV): ionization potential of the quantum dot.

2. The photoelectric conversion element according to claim 1, comprising a first interface layer between the first electrode and the photoelectric conversion layer.

3. The photoelectric conversion element according to claim 2,
   wherein the first interface layer contains at least one of TiO$_2$, ZnO, InGaZnO$_4$, and MoO$_3$.

4. The photoelectric conversion element according to claim 1, comprising a second interface layer between the photoelectric conversion layer and the second electrode.

5. The photoelectric conversion element according to claim 4,
   wherein the second interface layer contains at least one of MoO$_3$, NiO,
   and an organic compound having a triarylamine unit or a fluorene unit.

6. The photoelectric conversion element according to claim 1,
   wherein the quantum dot includes a nanoparticle, and
   the nanoparticle contains PbS, PbSe, PbTe, InP, InAs, CdS, CdSe, or CdTe.

7. The photoelectric conversion element according to claim 1,
   wherein the quantum dot includes a nanoparticle, and
   at least one organic ligand selected from the group consisting of 1,4-benzenedithiol and 1,3-benzenedithiol coordinates with the surface of the nanoparticle.

8. The photoelectric conversion element according to claim 1,
   wherein the quantum dot includes a nanoparticle, and
   at least one halogen selected from the group consisting of iodine, chlorine, and bromine is added to the surface of the nanoparticle.

9. The photoelectric conversion element according to claim 1,
   wherein the first electrode contains titanium or titanium nitride.

10. The photoelectric conversion element according to claim 1,
    wherein the E2 is more than 2.9 eV.

11. The photoelectric conversion element according to claim 1,
    wherein the band gap of the quantum dot is less than 0.9 eV.

12. The photoelectric conversion element according to claim 1,
wherein the organic compound contains at least one compound selected from:

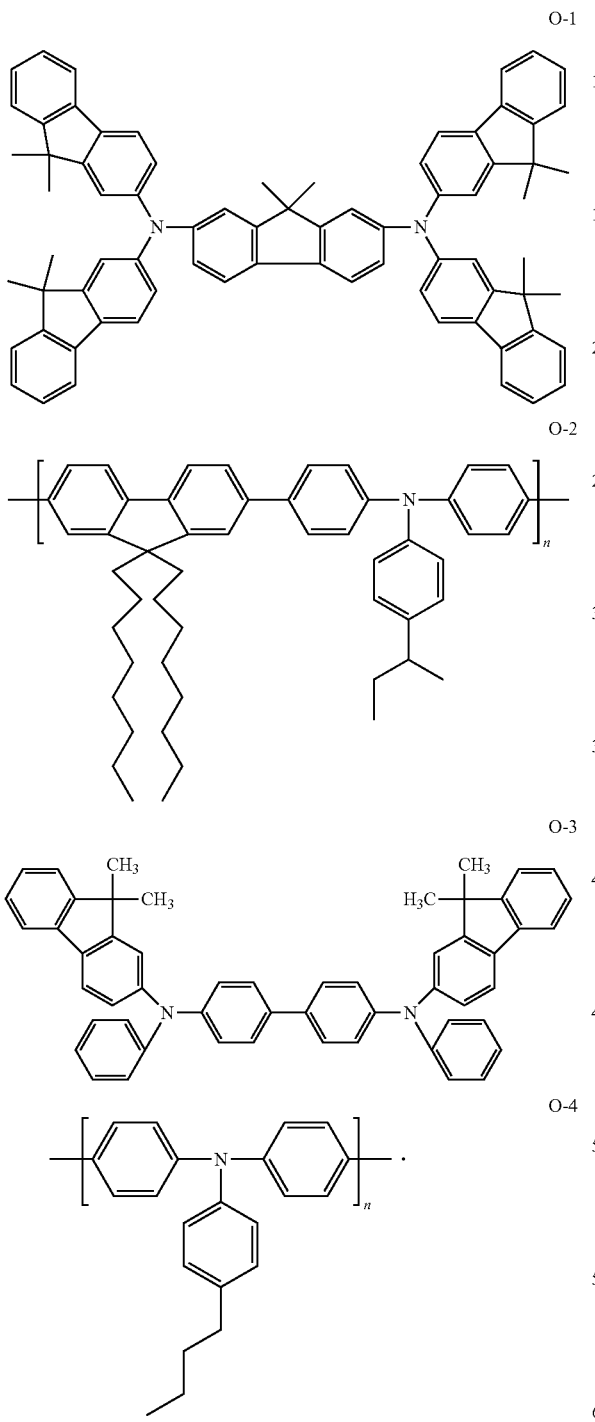

13. The photoelectric conversion element according to claim 1,
wherein at least one layer selected from the group consisting of a sealing layer, a lens layer, and a color filter layer is disposed on the first electrode or the second electrode.

14. An image sensor comprising:
a plurality of pixels; and
a signal processing circuit connected to the pixels,
wherein the pixels include the photoelectric conversion element according to claim 1 and a reading circuit connected to the photoelectric conversion element.

15. A light receiving element comprising:
the photoelectric conversion element according to claim 1;
a reading circuit to read an electric charge from the photoelectric conversion element; and
a signal processing circuit to receive the electric charge from the reading circuit and to perform signal processing.

16. An imaging apparatus comprising:
an optical system having a plurality of lenses; and
a light receiving element to receive light that passed through the optical system,
wherein the light receiving element includes the photoelectric conversion element according to claim 1.

17. A mobile unit comprising:
a bodywork provided with an imaging apparatus; and
a moving unit to move the bodywork,
wherein the imaging apparatus is the imaging apparatus according to claim 16.

18. A photoelectric conversion element comprising:
a first electrode;
a first interface layer;
a photoelectric conversion layer; and
a second electrode, in this order,
wherein the photoelectric conversion layer satisfies formula (1),
contains a quantum dot and an organic compound, and
the electron affinity of a material used for the first interface layer and the electron affinity of the quantum dot satisfy formula (4)

$$E2>E1 \qquad \text{formula (1)}$$

E1 (eV): energy at a short-wavelength edge in a wavelength region of light detected by the photoelectric conversion element
E2 (eV): band gap of the organic compound $$E3<E4-0.2 \qquad \text{formula (4)}$$

E3 (eV): electron affinity (eV) of a material used for the first interface layer
E4 (eV): electron affinity (eV) of the quantum dot.

19. The photoelectric conversion element according to claim 18, comprising a second interface layer between the photoelectric conversion layer and the second electrode.

20. An image sensor comprising:
a plurality of pixels; and
a signal processing circuit connected to the pixels,
wherein the pixels include the photoelectric conversion element according to claim 18 and a reading circuit connected to the photoelectric conversion element.

* * * * *